(12) United States Patent  
Kim et al.

(10) Patent No.: US 12,028,032 B2  
(45) Date of Patent: Jul. 2, 2024

(54) WIRELESS COMMUNICATION DEVICE FOR CONTROLLING SIGNAL POWER OF RECEIVED SIGNAL AND OPERATING METHOD THEREOF

(71) Applicant: SAMSUNG ELECTRONICS CO., LTD., Suwon-si (KR)

(72) Inventors: Joohan Kim, Yongin-si (KR); Shinwoo Kang, Seoul (KR); Beomkon Kim, Seoul (KR); Jungsu Han, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/705,888

(22) Filed: Mar. 28, 2022

(65) Prior Publication Data

US 2022/0360241 A1  Nov. 10, 2022

(30) Foreign Application Priority Data

May 10, 2021 (KR) .......................... 10-2021-0060341

(51) Int. Cl.
*H03G 3/30* (2006.01)
*H04B 1/16* (2006.01)
*H04L 27/26* (2006.01)

(52) U.S. Cl.
CPC ............ *H03G 3/3078* (2013.01); *H04B 1/16* (2013.01); *H04L 27/265* (2013.01)

(58) Field of Classification Search
CPC .................................................. H03G 3/3078

USPC ......................................................... 375/345
See application file for complete search history.

(56) References Cited

U.S. PATENT DOCUMENTS

| | | | |
|---|---|---|---|
| 7,822,153 | B2 | 10/2010 | Song et al. |
| 8,086,204 | B2 | 12/2011 | Uramoto et al. |
| 8,213,891 | B2 | 7/2012 | Kim et al. |
| 8,477,887 | B2 | 7/2013 | Challa et al. |
| 8,773,966 | B1 | 7/2014 | Petrovic et al. |
| 8,830,859 | B2 | 9/2014 | Weng et al. |
| 9,226,248 | B2 | 12/2015 | Zhang et al. |
| 9,544,862 | B2 | 1/2017 | Li et al. |
| 2010/0046679 | A1* | 2/2010 | Kajakine ............ H03G 3/3068 375/345 |
| 2011/0149773 | A1 | 6/2011 | Lee et al. |

FOREIGN PATENT DOCUMENTS

| KR | 10-0940872 B1 | 2/2010 |
|---|---|---|
| KR | 10-0943765 B1 | 2/2010 |
| KR | 10-1563517 B1 | 10/2015 |

* cited by examiner

*Primary Examiner* — Lihong Yu
(74) *Attorney, Agent, or Firm* — Fish & Richardson P.C.

(57) ABSTRACT

A method of controlling a signal power of a received signal received by a wireless communication device, the method including: measuring the signal power of the received signal at a plurality of time points in response to a gain control signal; calculating a variance of the signal power of the received signal at least some time points of the plurality of time points; and controlling the signal power of the received signal based on a gain level determined according to the variance of the signal power of the received signal.

18 Claims, 12 Drawing Sheets

WIRELESS COMMUNICATION DEVICE FOR CONTROLLING SIGNAL POWER OF RECEIVED SIGNAL AND OPERATING METHOD THEREOF

CROSS-REFERENCE TO RELATED APPLICATION

This application is based on and claims priority under 35 U.S.C. § 119 to Korean Patent Application No. 10-2021-0060341, filed on May 10, 2021, in the Korean Intellectual Property Office, the disclosure of which is incorporated by reference herein in its entirety.

BACKGROUND

1. Field

Embodiments relate to a wireless communication device, and more particularly, to a wireless communication device including a communication processor.

2. Description of the Related Art

In wireless communication devices, such as smartphones, tablets, and Internet of Things (IoT) devices, wideband code division multiple access (WCDMA, 3G), long term evolution (LTE), LTE Advanced (4G), or new radio (NR, 5G) technologies have been used for high-speed communication.

SUMMARY

Embodiments are directed to a method of controlling a signal power of a received signal received by a wireless communication device, the method including: measuring the signal power of the received signal at a plurality of time points in response to a gain control signal; calculating a variance of the signal power of the received signal at least some time points of the plurality of time points; and controlling the signal power of the received signal based on a gain level determined according to the variance of the signal power of the received signal.

Embodiments are directed to a communication processor, including: a power measuring module configured to measure signal power of a received signal at a plurality of time points in response to a gain control signal; a calculating module configured to calculate a variance of the signal power of the received signal at least some time points of the plurality of time points; and a gain determining module configured to provide, to a variable gain amplifier, a gain level at which the signal power of the received signal is controlled according to the variance of the signal power of the received signal.

Embodiments are directed to a wireless communication device, including: a receiving module configured to receive a gain control signal and a received signal; a communication processor configured to output a gain level determined according to a variance of a signal power of the received signal in response to the gain control signal; and a variable gain amplifier configured to control the signal power of the received signal based on the gain level. The communication processor may be configured to measure the signal power of the received signal at a plurality of time points, and to calculate the variance of the signal power of the received signal at least some time points of the plurality of time points.

BRIEF DESCRIPTION OF THE DRAWINGS

Features will become apparent to those of skill in the art by describing in detail example embodiments with reference to the attached drawings in which.

DETAILED DESCRIPTION

Figure 1:
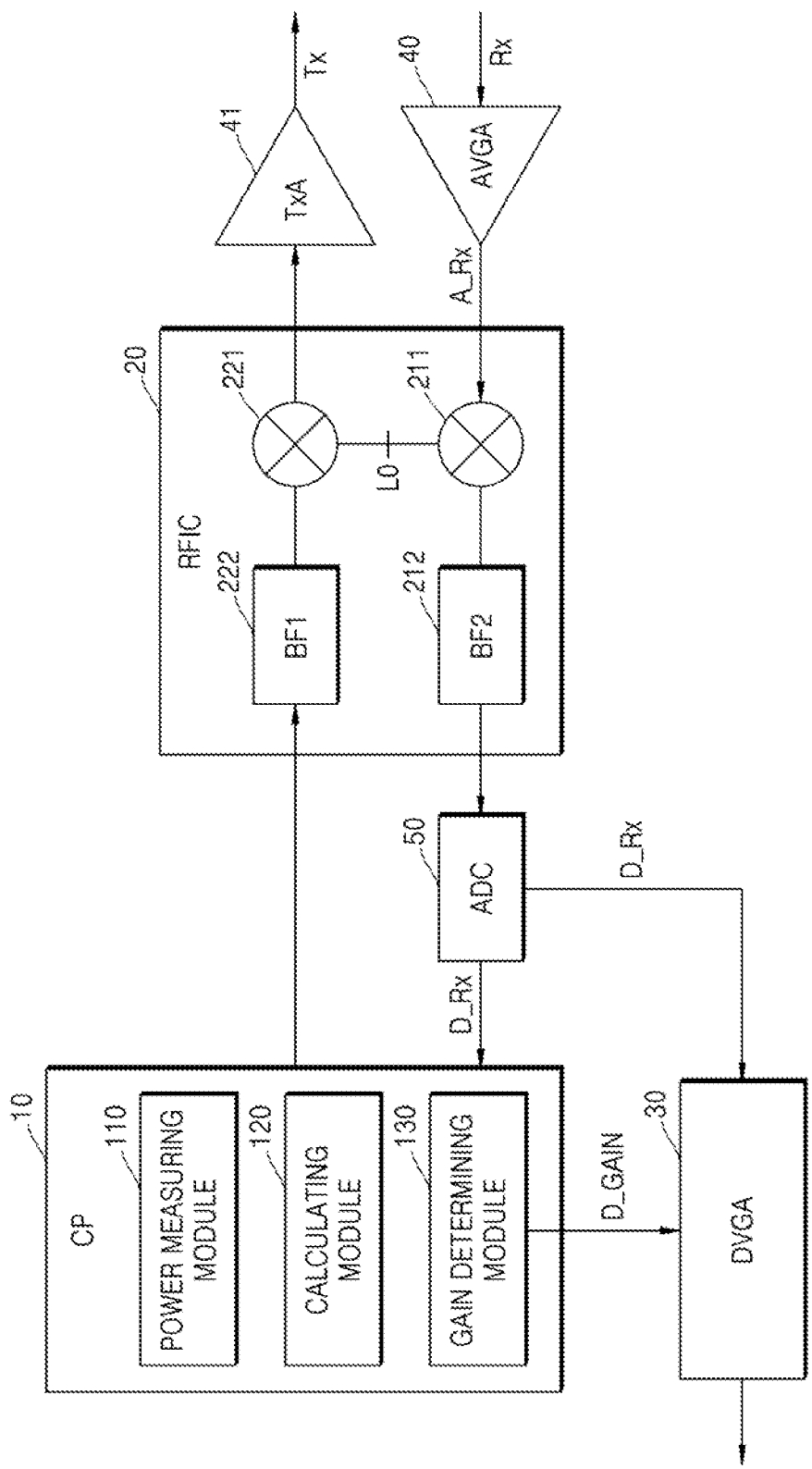
FIG. 1 is a block diagram of schematic configuration of a wireless communication device according to an example embodiment.

FIG. 1 is a block diagram of schematic configuration of a wireless communication device according to an example embodiment.

With reference to FIG. 1, a wireless communication device according to an example embodiment may include a communication processor 10, a radio frequency integrated circuit (RFIC) 20, a digital variable gain amplifier 30, an analog variable gain amplifier 40, a transmission amplifier 41, and an analog-digital converter 50.

The communication processor 10 may include a power measuring module 110, a calculating module 120, and a gain determining module 130.

The communication processor 10 may process a baseband signal including information to be transmitted (e.g., including I signal and Q signal) according to a determined communication method. Also, the communication processor 10 may process a received baseband signal according to a determined communication method. For example, the communication processor 10 may process a signal to be transmitted or a received signal according to a communication method, such as orthogonal frequency division multiplexing (OFDM), orthogonal frequency division multiple access (OFDMA), wideband code multiple access (WCDMA), high speed packet access+ (HSPA+), etc. The communication processor 10 may process a baseband signal according to various communication methods (i.e., a wide variety of communication methods employing technologies concerning modulation or demodulation of amplitudes and/or frequencies of a baseband signal).

The power measuring module 110, the calculating module 120, and the gain determining module 130 of the communication processor 10 may each be different hardware modules to output signals, but the power measuring module 110, the calculating module 120, and the gain determining module 130 may also be implemented as a processor including a single hardware module and performing different functions.

The analog variable gain amplifier 40 may receive a received signal Rx consisting of analog components, and amplify the received signal Rx to have a target signal power to provide the amplified received signal to the RFIC 20. The communication processor 10 may determine an analog gain level by the analog variable gain amplifier 40 based on a difference between signal power of the received signal Rx received by a wireless communication device and a target signal power, and the analog variable gain amplifier 40 may amplify the received signal Rx based on the analog gain level.

The transmission amplifier 41 may receive a power voltage, and generate a transmission signal by amplifying a signal received from the RFIC 20. The magnitude of the signal amplified by the transmission amplifier 41 may be determined based on a level of the provided power voltage.

For reference, a wireless communication device may receive and transmit signals through multiple frequency bands by using carrier aggregation (CA) technologies, and may include a plurality of transmission amplifiers 41 and analog variable gain amplifiers 40, each of which corresponds to respective carriers. Herein, for convenience in explanation, example embodiments may simply describe examples where there is one analog variable gain amplifier 40 and one transmission amplifier 41.

The RFIC 20 may generate a RF transmission signal by performing frequency up-conversion on a signal received from the communication processor 10. The RFIC 20 may receive an analog-amplified received signal from the analog variable gain amplifier 40, and perform frequency down-conversion on the analog-amplified received signal. For example, the RFIC 20 may include a transmission circuit for the frequency up-conversion, a receiving circuit for the frequency down-conversion, and a local oscillator LO.

The transmission circuit of the RFIC 20 may include a first baseband filter 222 and a first mixer 221, and the receiving circuit of the RFIC 20 may include a second baseband filter 212 and a second mixer 211.

The first baseband filter 222 may include a low pass filter. The first baseband filter 222 may filter a signal received from the communication processor 10, and provide the filtered signal to the first mixer 221.

The first mixer 221 may perform the frequency up-conversion, by which a frequency of a signal received from the communication processor 10 is converted from a baseband to a high frequency band through a frequency signal provided by the local oscillator LO.

The receiving circuit of the RFIC 20 may include a low noise amplifier including a low-pass filter, and a received signal filtered by the low noise amplifier may be provided to the second mixer 211.

The second mixer 211 may perform the frequency down-conversion, by which a frequency of an analog-amplified received signal A_Rx is converted from a high frequency band to a baseband through a frequency signal provided by the local oscillator LO. The down-converted signal may be provided to the second baseband filter 212, and the second baseband filter 212 may provide the filtered signal to the analog-digital converter 50.

The analog-digital converter 50 may convert an analog signal received from the RFIC 20 into a digital signal D_Rx. Referring to FIG. 1, the analog-digital converter 50 may convert a signal, which has been down-converted into a baseband by the RFIC 20, into the digital signal D_Rx. In another implementation, the analog-digital converter 50 may receive an analog-amplified received signal from the analog variable gain amplifier 40 to convert the same into a digital signal, and also perform the frequency down-conversion of a digital signal converted by the RFIC 20 into a baseband.

The communication processor 10 may receive the digital signal D_Rx and determine a gain level D_GAIN of the digital variable gain amplifier 30 based on signal power of the digital signal D_Rx. The communication processor 10 may measure signal power of the digital signal D_Rx at a plurality of time points, and calculate a variance of pieces of signal power at each time point. The communication processor 10 may determine the gain level D_GAIN to be provided to the digital variable gain amplifier 30 according to a variance of signal power.

The digital variable gain amplifier 30 may control signal power of the digital signal D_Rx based on the gain level D_GAIN. The digital variable gain amplifier 30 may provide a digital signal, of which signal power has been controlled, to an FFT module configured to perform FFT operations. The FFT module may perform the FFT operations based on the digital signal D_Rx, of which signal power has been controlled.

Accordingly, after the FFT operations are performed, a signal in the frequency domain corresponding to each frequency resource may not be saturated, and subsequent operations may be performed. For example, the subsequent operations may be operations of demodulating digital signals in OFDM communication.

The wireless communication device may further include a duplexer and an antenna. The duplexer may be connected to the antenna to separate a transmission frequency from a received frequency. For example, the duplexer may separate RF output signals provided from the transmission amplifier 41 by frequency band, and provide each separated signal to corresponding antennas. Also, the duplexer may provide a received signal provided from the antenna to the RFIC 20. The duplexer may include a front end module with integrated duplexer (FEMiD).

The communication processor 10, the RFIC 20, the digital variable gain amplifier 30, the analog variable gain amplifier 40, the transmission amplifier 41, and the analog-digital converter 50 may be separately implemented by an integrated circuit (IC), a chip, or a module. The communication processor 10, the RFIC 20, the digital variable gain amplifier 30, the analog variable gain amplifier 40, the transmission amplifier 41, and the analog-digital converter 50 may be embedded together in a printed circuit board (PCB). In another implementation, at least some of the communication processor 10, the RFIC 20, the digital variable gain amplifier 30, the analog variable gain amplifier 40, the transmission amplifier 41, and the analog-digital converter 50 may be implemented as a single communication chip.

The wireless communication device of FIG. 1 may be included in a wireless communication system using cellular networks (such as 5G, LTE, LTE-Advanced, etc.), a wireless local area network (WLAN) system, or any other wireless communication system. For reference, the configuration of the wireless communication system of FIG. 1 is merely an example, and the wireless communication system may be implemented in various ways according to communication protocols or communication methods.

Figure 2:
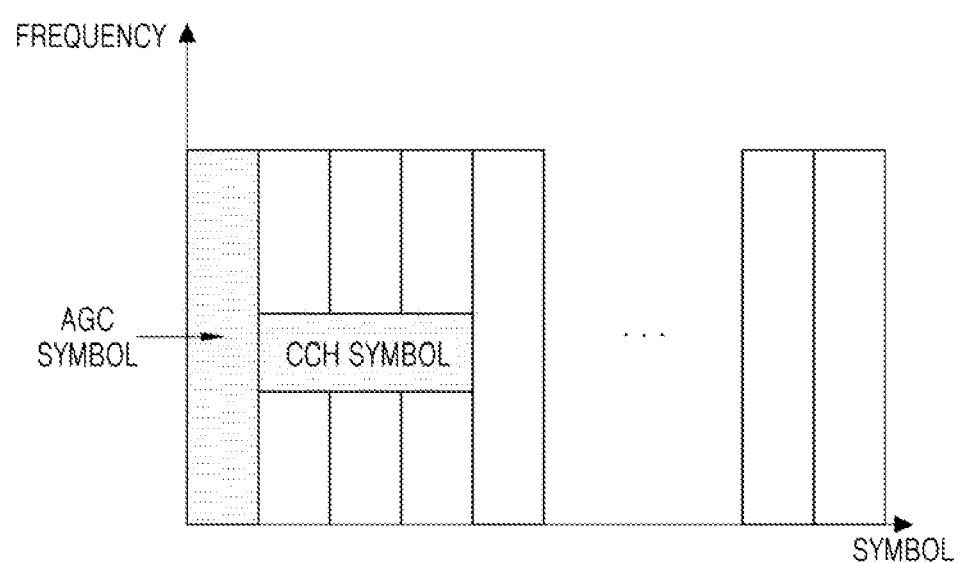
FIG. 2 is a diagram of symbols of a received signal received by a wireless communication device according to an example embodiment.

FIG. 2 is a diagram of symbols of a received signal that is received by a wireless communication device according to an example embodiment.

With reference to FIG. 2, when a gain control signal (directing control of a gain) is received, the wireless communication device according to a comparative example may control gain levels of the analog variable gain amplifier and the digital variable gain amplifier so that signal power of a received signal approaches a preset target signal power. However, when the wireless communication device generates a signal in the frequency domain by performing the FFT operations, average signal power of a signal in the frequency domain may vary according to the number of resources allocated to wireless communication.

When the wireless communication device amplifies pieces of signal power of received signals to target signal power all at once according to a comparative example, a signal in the frequency domain may be in a saturated state when subsequent operations are performed after the FFT operations. Accordingly, it may be important that the wireless communication device obtains information about frequency resources allocated to wireless communication quickly after receiving the gain control signal.

Referring to FIG. 2, the wireless communication device according to a comparative example may obtain information about allocated frequency resources by, after receiving the gain control signal, demodulating subsequent signals and obtaining information regarding a control channel (CCH). For example, as for vehicle-to everything (V2X) communications in which a plurality of wireless communication devices perform communications, and at least one wireless communication device moves at a high speed according to wireless access technologies regarding new radio (NR), it may be important that a received signal is amplified to have optimal signal power corresponding to a frequency domain before demodulation of subsequent signals, as further described in detail with reference to FIGS. 13A and 13B.

A wireless communication device according to an example embodiment may estimate frequency resource information according to a variance of signal power of a received signal before obtaining information about allocated frequency resources by demodulating subsequent signals, and control a gain level of the variable gain amplifier so that a signal in the frequency domain may not be saturated according to the frequency resource information.

Hereinafter, an example embodiment in which frequency resources are allocated to wireless communication will be described with reference to FIG. 3, and an example embodiment in which a signal amplified to have a target signal power is generated as a signal having signal power saturated in the frequency domain will be described with reference to FIGS. 4 and 5.

Figure 3:
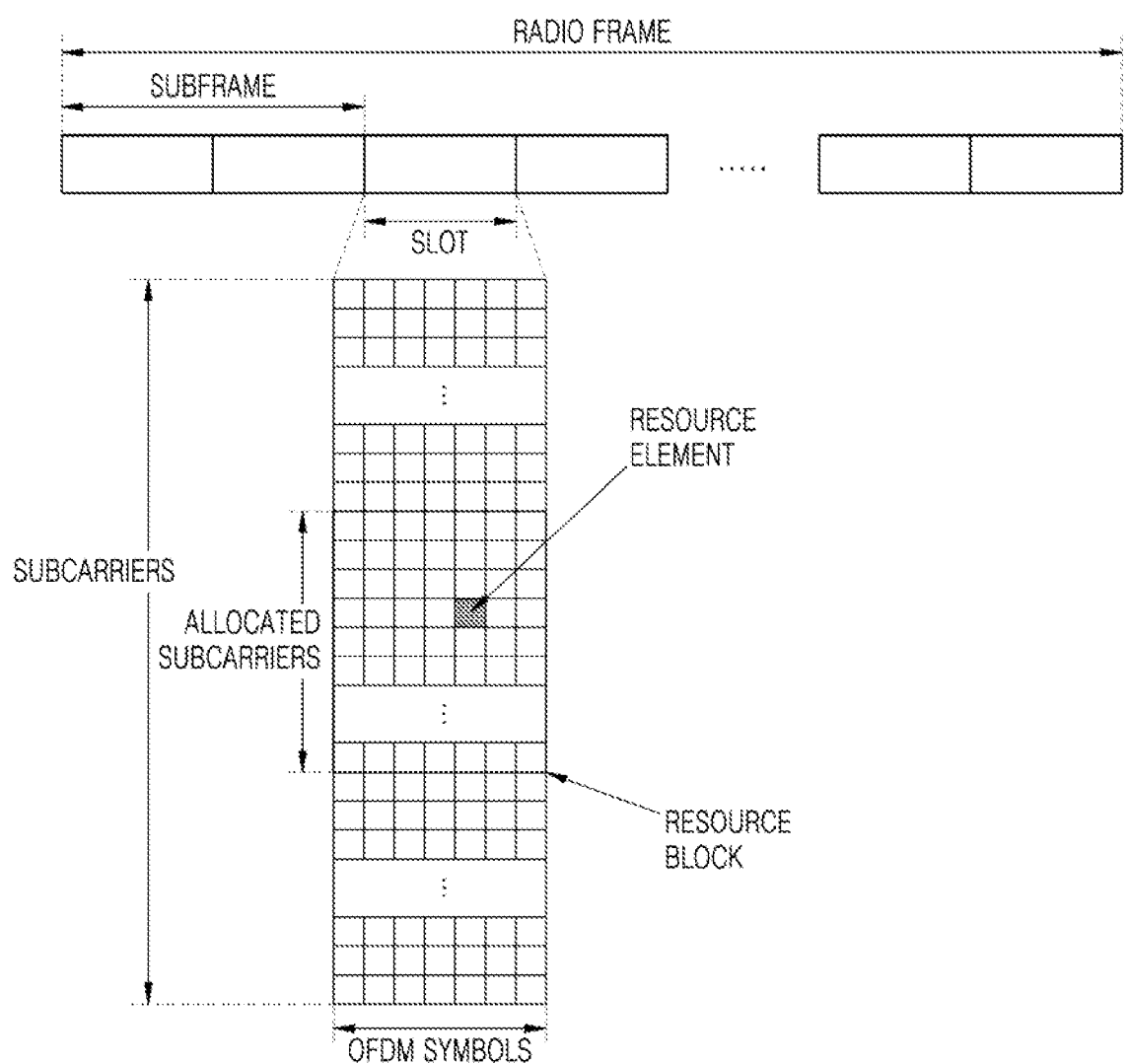
FIG. 3 is a diagram of allocated resources according to an example embodiment.

FIG. 3 is a diagram of allocated resources according to an example embodiment.

In FIG. 3, the horizontal axis represents the time domain, and the vertical axis represents the frequency domain.

In the time domain, the minimum transmission unit is an OFDM symbol. A plurality of OFDM symbols may constitute a single slot, and two slots may constitute a single subframe. For example, in an LTE wireless access network, the length of a slot may be 0.5 ms, and the length of a subframe may be 1.0 ms. Further, a radio frame is a time domain unit consisting of ten subframes.

In the frequency domain, the minimum transmission unit is a subcarrier, and the bandwidth of the entire system transmission band may consist of a plurality of subcarriers.

In time-frequency domain, the basic unit of a resource is a resource element (RE), which may be represented by an OFDM symbol index and a subcarrier index. A resource block (RB) or a physical resource block (PRB) may be defined by multiple consecutive OFDM symbols in the time domain and multiple consecutive subcarriers in the frequency domain. In general, the minimum transmission unit of data may be the RB, and hereinafter, the number of frequency resources may refer to the number of subcarriers or the number of RBs allocated to wireless communication.

Figure 4:
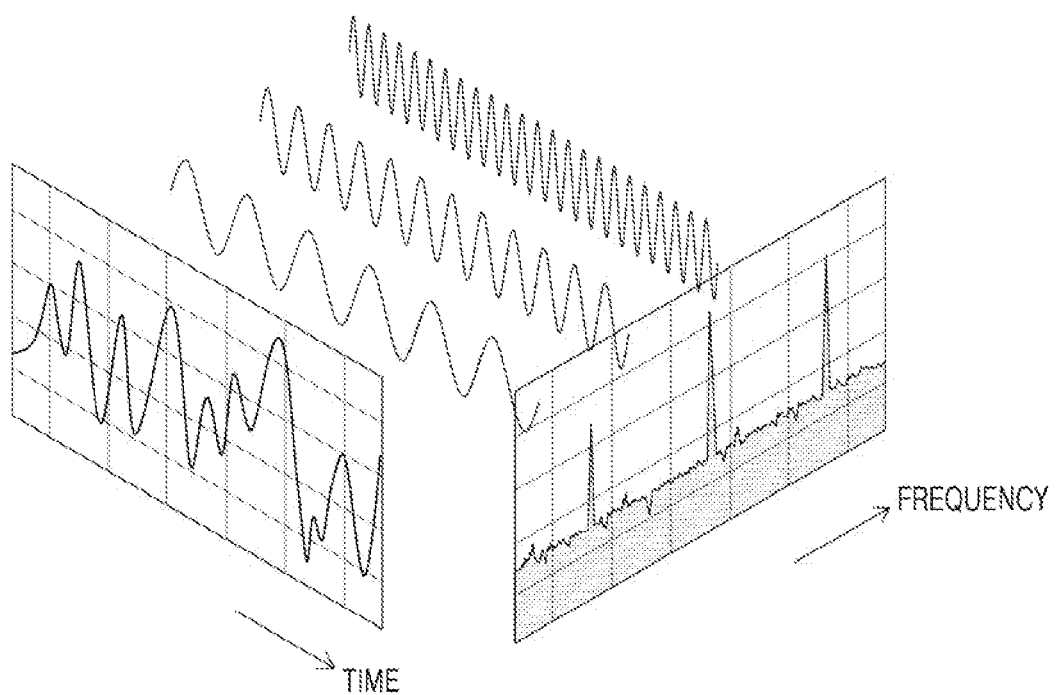
FIG. 4 is a diagram illustrating conversion of a received signal in the time domain into a received signal in the frequency domain by performing fast Fourier transform (FFT) operations according to an example embodiment.

FIG. 4 is a diagram illustrating conversion of a received signal in the time domain into a received signal in the frequency domain by performing FFT operations according to an example embodiment.

With reference to FIG. 4, the communication processor 10 may perform the FFT operations. And after the FFT operations, a received signal in the time domain may be extracted as a received signal in the frequency domain. At this time, a total amount of signal power of a received signal sampled in the time domain may be identical to that of a received signal in the frequency domain, which may be represented by the following Equation 1.

$$FD_{AVG} * N_{Resource} = TD_{AVG} * N_{FFT} \quad \text{[Equation 1]}$$

In Equation 1, $FD_{AVG}$ represents average signal power of a received signal in the frequency domain, and $TD_{AVG}$ represents average signal power of a received signal in the time domain, $N_{FFT}$ represents the number of subcarriers included in a predesignated bandwidth in a wireless communication system, and $N_{RESOURCE}$ represents the number of subcarriers allocated in wireless communication being performed.

Referring to FIG. 2, $N_{RESOURCE}$ may be obtained by decoding information regarding a CCH. In another implementation, the wireless communication device may control a gain level by estimating $N_{RESOURCE}$ based on a variance of signal power of a received signal so that average signal power of the received signal in the frequency domain is not saturated.

Figure 5:
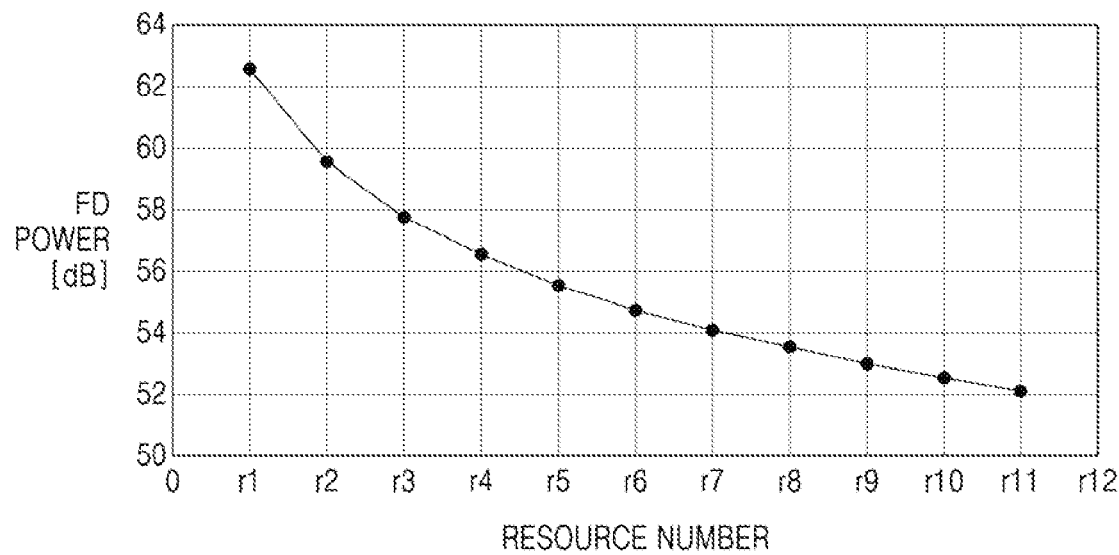
FIG. 5 is a graph showing average signal power of a received signal in the frequency domain, generated by performing FFT operations according to allocated resources.

FIG. 5 is a graph showing average signal power of a received signal in the frequency domain, generated by performing the FFT operations according to allocated resources.

With reference to FIG. 5 and Equation 1, average signal power of a received signal in the frequency domain may be represented by the following Equation 2.

$$FD_{AVG} = TD_{AVG} * N_{FFT} / N_{Resource} \quad \text{[Equation 2]}$$

It can be seen from Equation 2 that average signal power in the frequency domain may be inversely proportional to the number of allocated frequency resources. Accordingly, with a small number of frequency resources, signal power per allocated frequency during or after performing the FFT operations may increase over a target signal power, which may cause saturation.

For example, referring to FIG. 5, if average signal power of a received signal in the time domain is converged to a target signal power of 51 dB by the analog variable gain amplifier, and the number of frequency resources is r1, then average signal power of the received signal in the frequency domain may increase to about 63 dB.

The analog variable gain amplifier may amplify a received signal so that signal power of the received signal in the time domain reaches a target signal power, and the wireless communication device according to the present example embodiment may prevent saturation of signal power in the frequency domain by estimating the number of allocated frequency resources and controlling a gain level of the digital variable gain amplifier based on the number of frequency resources. For example, when the number of frequency resources is small, a low gain level may be provided to the digital variable gain amplifier, and when the number of frequency resources is large, a high gain level may be provided to the digital variable gain amplifier.

Figure 6:
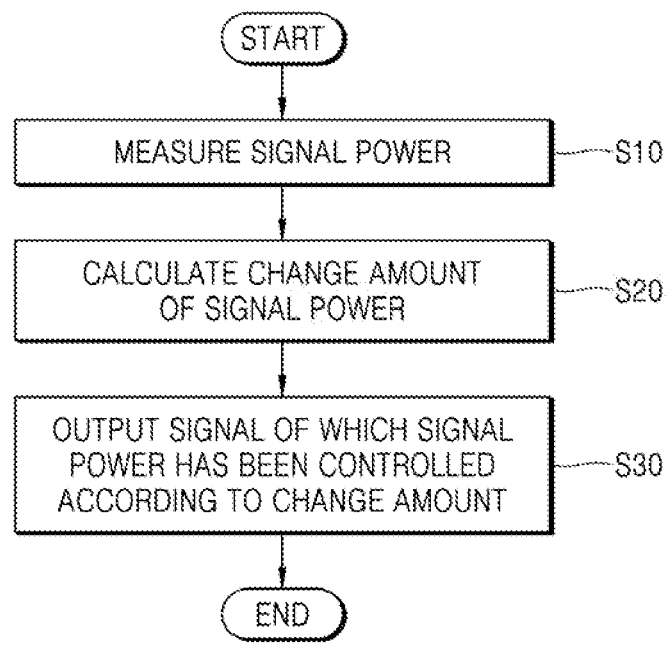
FIG. 6 is a flowchart of an operating method of a wireless communication device according to an example embodiment.

FIG. 6 is a flowchart of an operating method of a wireless communication device according to an example embodiment.

With reference to FIG. 6, the wireless communication device may output a digital signal, of which signal power has been controlled according to a variance of signal power by measuring signal power of a received signal. The received signal, of which signal power is measured by the wireless communication device, may be a digital signal.

In operation S10, the wireless communication device may measure signal power of a received signal at a plurality of time points. For example, the plurality of time points may be time points when a digital signal is sampled, and the signal power of the received signal may be estimated based on a digital signal converted from an analog signal.

In operation S20, the wireless communication device may calculate a variance of signal power based on signal power of the received signal measured at the plurality of time points. The wireless communication device may calculate a variance of signal power based on a difference between signal power at an object time point and signal power at a time point other than the object time point. The time point other than the object time point may be, e.g., a time point immediately before or after the object time point, but it may also refer to any time points with which a difference in signal power may be calculated.

In operation S30, the wireless communication device may output a signal having controlled signal power by controlling a gain level input to the variable gain amplifier based on the variance of signal power. Accordingly, the wireless communication device may estimate allocated frequency resources based on a variance of signal power before detecting the allocated frequency resources based on CCH information, and control signal power of a received signal based on the estimated number of frequency resources.

Figure 7:
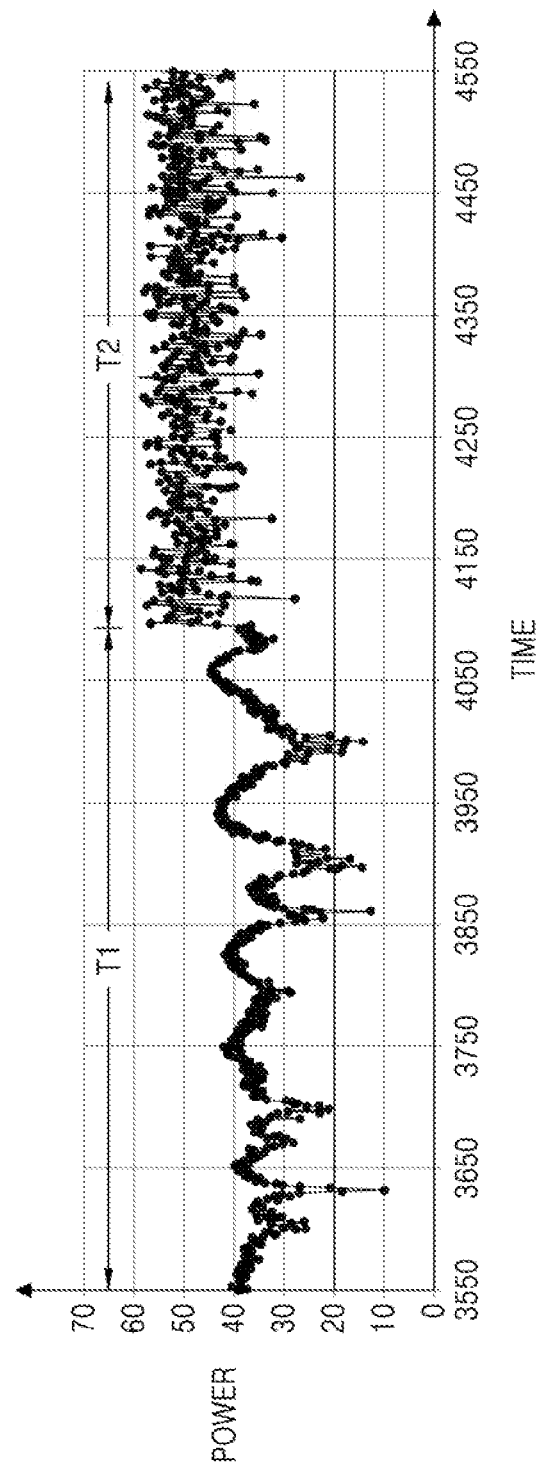
FIG. 7 is a graph showing signal power measured according to an example embodiment.
Figure 8:
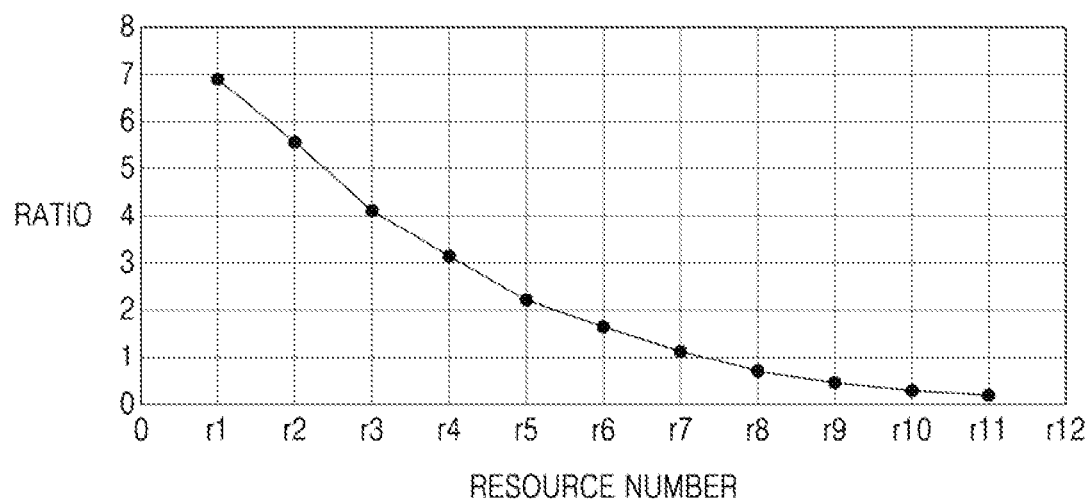
FIG. 8 is a graph showing a variance of signal power according to allocated resources.

FIG. 7 is a graph showing signal power measured according to an example embodiment. FIG. 8 is a graph showing a variance of signal power according to allocated resources.

With reference to FIG. 7, the wireless communication device may measure signal power of a received signal at a first time T1 and a second time T2, which have different numbers of allocated frequency resources. For example, the number of frequency resources allocated to wireless communication at the second time T2 may be greater than the number of allocated frequency resources at the first time T1.

Referring to FIG. 7, when different numbers of frequency resources are allocated, the deviation in signal power measured in the time domain may also be different. For example, the deviation in signal power at the second time T2 (to which the greater number of frequency resources are allocated) may be larger.

The wireless communication device may calculate a variance of signal power by dividing an average (mean) of measured signal power ($Pow_i$) by an average of differences in signal power at adjacent time points, such that the variance of signal power may be represented by the ratio of the following Equation 3.

$$P_{ratio} = \text{mean}(Pow_i)/\text{mean}(|Pow_i - Pow_{i+1}|) \quad \text{[Equation 3]}$$

For the case that the difference in signal power of adjacent time points at the second time T2 is greater than that the first time T1, the wireless communication device may obtain a smaller variance of signal power at the second time T2 (to which the greater number of frequency resources are allocated). Equation 3 is merely an example for determining variance of signal power, and the variance of signal power may include all information indicating the deviation of signal power.

With reference to FIG. 8, the smaller the number of frequency resources is, the greater the variance of signal power calculated according to Equation 3 may be. The wireless communication device may estimate the number of frequency resources allocated to wireless communications by calculating the variance of signal power. For example, when the wireless communication device obtains '4' as a variance of signal power, the number of frequency resources allocated to wireless communication may be estimated as r3.

Figure 9:
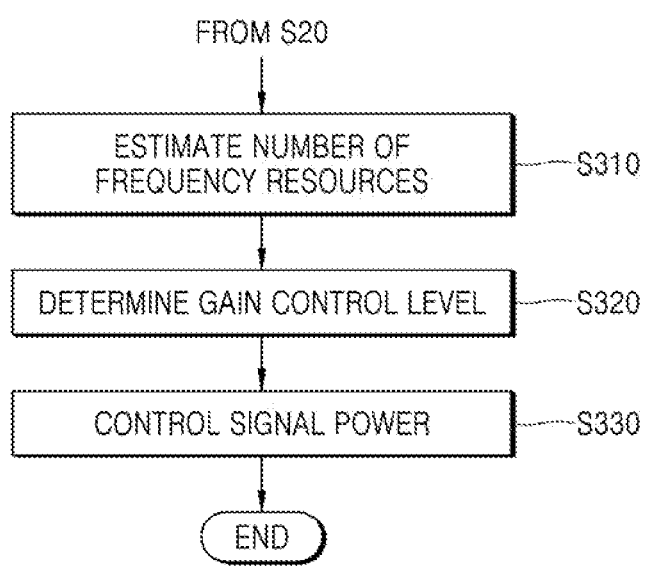
FIG. 9 is a flowchart of a method of controlling signal power based on the number of frequency resources according to an example embodiment.

FIG. 9 is a flowchart of a method of controlling signal power based on the number of frequency resources according to an example embodiment.

With reference to FIG. 9, the wireless communication device may estimate the number of frequency resources allocated to wireless communication by calculating a variance of signal power, and control the signal power based on the estimated number of frequency resources.

In operation S310, the wireless communication device may estimate the number of frequency resources based on a variance of signal power. The variance of signal power may be, e.g., a value calculated according to Equation 3 as described with reference to FIGS. 7 and 8. For example, a memory device of the wireless communication device may store a frequency resource number estimation table corresponding to a variance of signal power, and the communication processor 10 may estimate the number of frequency resources based on the table. In another implementation, the number of frequency resources may be estimated by, e.g., comparing a variance of signal power with a preset reference variance.

In operation S320, the wireless communication device may determine a gain level to be input to the variable gain amplifier, based on an estimated number of frequency resources. The method of determining a gain level according to the number of frequency resources by the wireless communication device will be further described with reference to FIG. 10.

In operation S330, the wireless communication device may control the signal power of the received signal according to the determined gain level. For example, the variable gain amplifier may control an amplification degree of the received signal converted into a digital signal based on a gain level determined by the communication processor 10.

Figure 10:
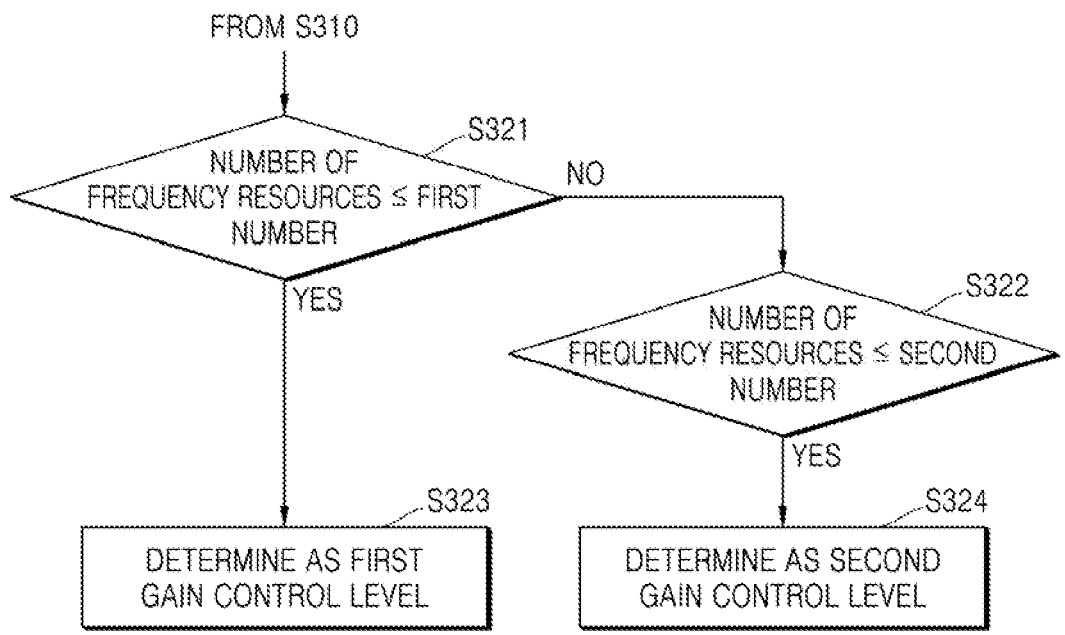
FIG. 10 is a flowchart of a method of determining a gain level by comparing the number of frequency resources with a preset number according to an example embodiment.

FIG. 10 is a flowchart of a method of determining a gain level by comparing the number of frequency resources with a preset number, according to an example embodiment.

With reference to FIG. 10, the wireless communication device may determine a gain level based on a preset reference number related to the number of frequency resources in operation S320 in FIG. 9. In operation S321, the wireless communication device may compare the estimated number of frequency resources with a first number. In operation S323, when the wireless communication device determines that the number of frequency resources is less than or equal to the first number, a gain level to be input to the variable gain amplifier may be determined as a first gain level.

In operation S321, when the wireless communication device determines that the number of frequency resources is greater than the first number, whether the number of frequency resources is less than or equal to a second number may be determined in operation S322. The second number may be greater than the first number, and with reference to FIG. 8, the first number may be r1, and the second number may be r2.

In operation S324, when the wireless communication device determines that the number of frequency resources is less than or equal to the second number, a gain level to be input to the variable gain amplifier may be determined as a second gain level. At this time, the second gain level may have a value greater than the first gain level. With reference to FIG. 5, as the number of frequency resources decreases, the average signal power in the frequency domain after the FFT operations may increase. The wireless communication device may prevent saturation of a signal by controlling signal power in the time domain with a smaller number of frequency resources, i.e., to be less than that with a greater number of frequency resources.

Figure 11:
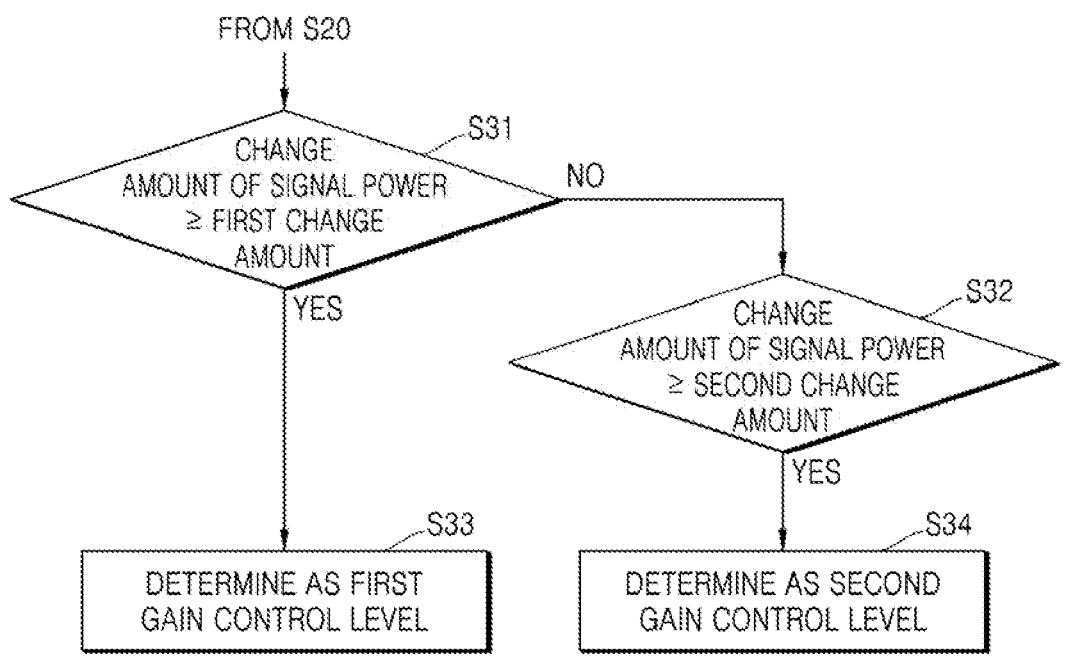
FIG. 11 is a flowchart of a method of determining a gain level by comparing a variance of signal power with a preset variance according to an example embodiment.

FIG. 11 is a flowchart of a method of determining a gain level by comparing a variance of signal power with a preset variance, according to an example embodiment.

With reference to FIG. 11, the wireless communication device may determine a gain level to be applied to the variable gain amplifier based on a variance of signal power, according to the correlation between the variance of signal power and the number of frequency resources as described in the example embodiments of FIGS. 7 to 10.

In operation S31, the wireless communication device may compare a calculated variance of signal power to a first variance. In operation S33, when the wireless communication device determines that the variance of signal power is greater than or equal to the first variance (in operation S31), a gain level to be input to the variable gain amplifier may be determined as a first gain level.

In operation S31, when the wireless communication device determines that the variance of signal power is less than the first variance, whether the variance of signal power is greater than or equal to a second variance may be determined in operation S32. The second variance may be a value smaller than the first variance.

In operation S34, when the wireless communication device determines that the variance of signal power is greater than or equal to the second variance (in operation S32), a gain level to be input to the variable gain amplifier may be determined as a second gain level. At this time, the second gain level may have a value greater than the first gain level.

Figure 12:
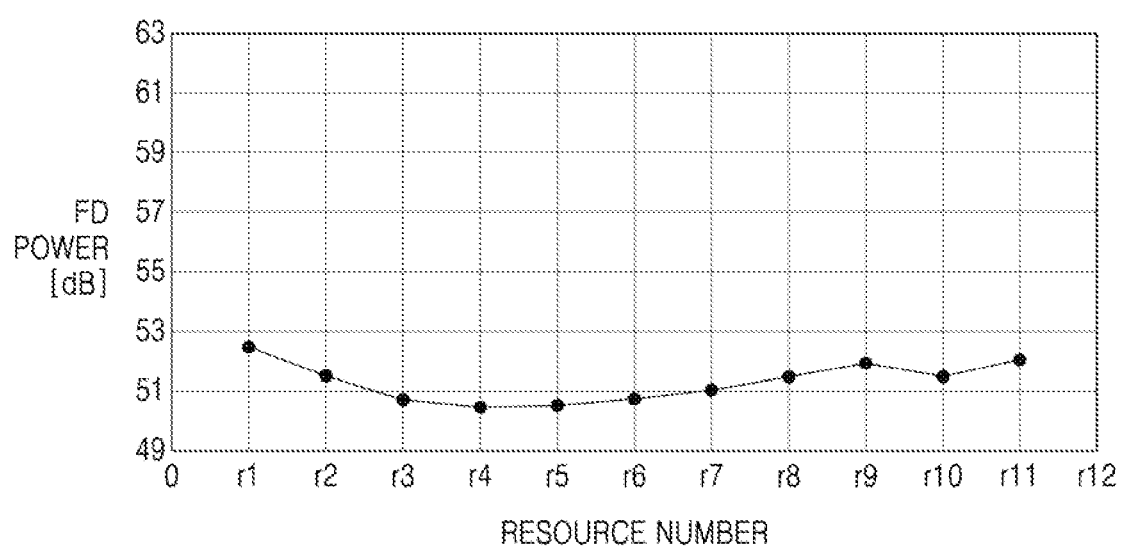
FIG. 12 is a graph showing average signal power of a received signal in the frequency domain, generated based on a controlled gain level according to an example embodiment.

FIG. 12 is a graph showing average signal power of a received signal in the frequency domain, generated based on a controlled gain level, according to an example embodiment.

FIG. 5 may represent average signal power of the received signal in the frequency domain after performing the FFT operations when the received signal is amplified to have a constant gain level regardless of the number of frequency resources. On the other hand, FIG. 12 may represent average signal power of the received signal in the frequency domain when the received signal is amplified to have a gain level determined based on the number of frequency resources according to the embodiments of FIGS. 6 to 11.

According to the present example embodiment, the wireless communication device may amplify the received signal by a small value by providing a gain level of a small value when the number of allocated frequency resources is small. Referring to FIG. 5, if the signal is amplified with the same gain level, as the number of frequency resources is reduced, the more significantly the average signal power after the FFT operations may increase. The wireless communication device according to the present example embodiment may amplify the signal with a small gain level when less frequency resources are allocated. Accordingly, with reference to FIG. 12, average signal power in the frequency domain after the FFT operations, corresponding to the number of frequency resources may have a similar value.

Figure 13A:
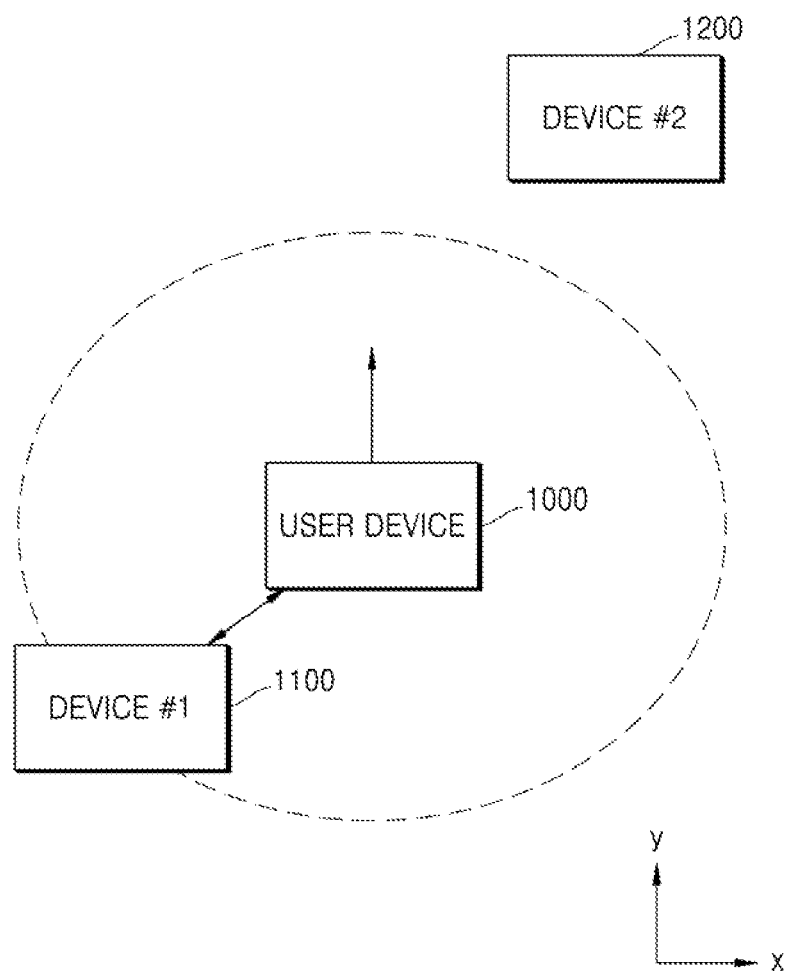
FIGS. 13A and 13B are diagrams illustrating the cases where a method of controlling signal power is performed when a user device is moving according to an example embodiment.
Figure 13B:
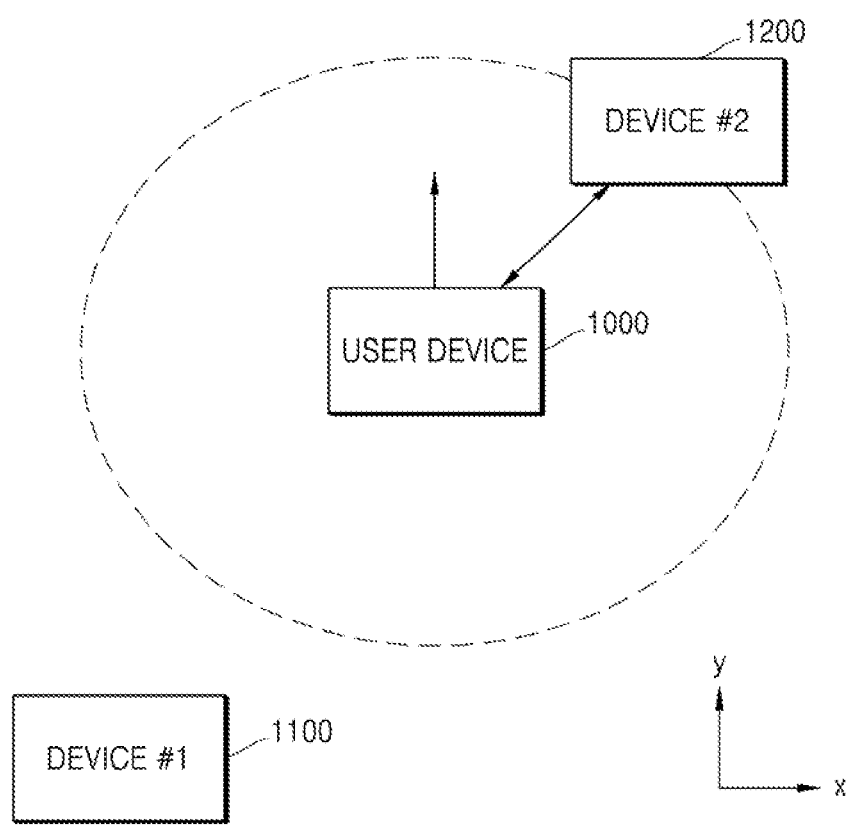

FIGS. 13A and 13B are diagrams illustrating cases where a method of controlling signal power is performed when a user device is moving, according to an example embodiment.

The wireless communication device according to the example embodiments of FIGS. 6 to 12 may quickly control signal power of the received signal according to frequency resources allocated to wireless communication before detecting the CCH information. Thus, the wireless communication device may be more efficient in such situations where communication systems need to be switched quickly.

With reference to FIGS. 13A and 13B, when the wireless communication system constitutes, e.g., a Vehicle-to-Everything (V2X) system, a user device 1000 may be moving quickly, or may need to continuously change objects with which the user device 1000 establishes communications. FIGS. 13A and 13B illustrate a plurality of devices performing V2X communication according to an example embodiment, and at least one of the user device 1000, a first device 1100, and a second device 1200 may be a moving vehicle.

First, as for the communication between the user device 1000 and the first device 1100, or the second device 1200, the type of communication may be one-to-one communication, that is, unicast communication using sidelinks.

The signal exchange between the user device 1000 and the first device 1100, or the second device 1200 through unicast may include scrambling, mapping of control information, data transfer, confirmation of a unique ID value, etc. by using promised resources or values between the user device 1000 and the first device 1100, or the second device 1200.

According to an example embodiment, the communication between the user device 1000 and the first device 1100, or the second device 1200 may be groupcast communication, which transmits common data to other devices within a group through a sidelink. At the time of groupcast communication, other devices that are not included in the group may not receive signals transmitted for the groupcast.

For reference, a device for transmitting a signal for the groupcast may be a terminal within a group, other than the user device 1000 (i.e., the first device 1100 and the second device 1200). Also, the resource allocation for signal transmission may be determined by a terminal that serves as a leader in a base station or a group, or may be selected by a terminal for transmitting a signal.

When the user device 1000 receives common data via the groupcast communication with the first device 1100 or the second device 1200, feedback information regarding the success or failure in reception of the data may be transmitted. Although it is not shown in the drawings, the information regarding the success or failure in reception of the data may be transmitted among terminals communicating by unicast communication.

For reference, the information concerning the success or failure in reception of the data may be hybrid automatic repeat request (HARQ)-acknowledgment/negative-acknowledgment (ACK/NACK) information, and the HARQ-ACK/NACK information may be included in a physical sidelink feedback channel (PSFCH).

Referring to FIGS. 13A and 13B, when the user device 1000 moves along the y-axis, and the first device 1100 and the second device 1200 are stationary, the user device 1000 may change the communication system from a first wireless communication with the first device 1100 to a second wireless communication with the second device 1200. At this time, the number of frequency resources allocated to the first wireless communication and the second wireless communication may be different, and the user device 1000 may control an amplification degree of the received signal by detecting the number of frequency resources allocated to the second wireless communication.

The user device 1000 may estimate the number of frequency resources allocated to the second wireless communication based on a variance of signal power of the received signal, and control the amplification degree of the received signal based on the estimated number of frequency resources. Thus, the user device 1000 performing V2X communication may measure signal power of the received signal at a plurality of time points in response to a gain control signal, calculate a variance of signal power at some time points of the plurality of time points, and control the signal power of the received signal based on a gain level determined according to the variance of the signal power.

Figure 14:
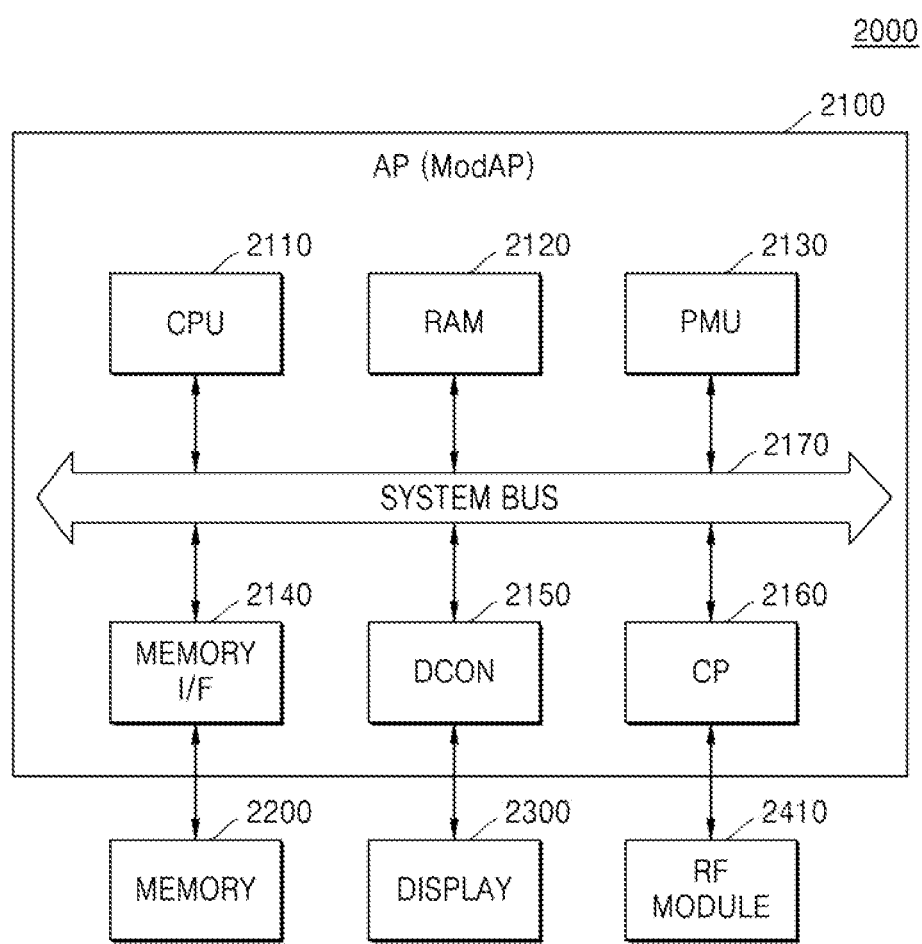
FIG. 14 is a block diagram of a wireless communication device according to an example embodiment.

FIG. 14 is a block diagram of a wireless communication device according to an example embodiment.

Referring to FIG. 14, a wireless communication device 2000 may include an application processor (AP) 2100, a memory 2200, a display 2300, an RF module 2410, and various components such as a lens, a sensor, an audio module, etc.

The AP 2100 may be implemented by a System-on-Chip (SoC), and may include a central processing unit (CPU) 2110, a read only memory (RAM) 2120, a power management unit (PMU) 2130, a memory interface (I/F) 2140, a display controller (DCON) 2150, a communication processor (CP) 2160, and a system bus 2170. The AP 2100 may further include various Intellectual Properties (IPs). As functions of a communication processor chip are integrated into the AP 2100, the AP 2100 may be referred to as ModAP.

The CPU 2110 may control overall operations of the AP 2100 and the wireless communication device 2000. The CPU 2110 may control operations of each component of the AP 2100. The CPU 2110 may be implemented as a multi-core unit, which is a computing component having two or more independent cores.

The RAM 2120 may temporarily store programs, data, or instructions. For example, the programs and/or data stored in the memory 2200 may be temporarily stored in the RAM 2120 according to control or booting code of the CPU 2110. The RAM 2120 may be implemented by DRAM or SRAM.

The PMU 2130 may manage the power of each component of the AP 2100. The PMU 2130 may determine operational situations or status of each component of the AP 2100 and control the operations, e.g., power management operations.

The memory interface 2140 may control overall operations of the memory 2200 and control data exchange between each component of the AP 2100 and the memory 2200. The memory interface 2140 may write data to the memory 2200 or read data from the memory 2200 according to a request from the CPU 2110.

The display controller 2150 may transmit, to the display 2300, image data to be displayed on the display 2300.

The display 2300 may be implemented by a flat display, such as a liquid crystal display (LCD), an organic light emitting diode (OLED) display, or a flexible display.

For wireless communications, the communication processor 2160 may modulate transmission data to be suitable for wireless environment, and recover received data. The communication processor 2160 may perform digital communication with the RF module 2410. The communication processor 10 described above, e.g., with reference to FIG. 1, may be implemented in the communication processor 2160.

The RF module 2410 may convert a high frequency signal received through an antenna into a low frequency signal, and transmit the low frequency signal to the communication processor 2160. The RF module 2410 may convert a low frequency signal received from the communication processor 2160 into a high frequency signal, and transmit the high frequency signal to the outside of the wireless communication device 2000 via an antenna. The RF module 2410 may amplify or filter a signal.

By way of summation and review, a wireless communication device for transmitting and receiving data through orthogonal frequency division multiplexing (OFDM) may perform fast Fourier transform (FFT) operations, which involve demodulation of received signals in the time domain to received signals in the frequency domain, to decode received information.

As described above, embodiments may provide an operating method of a wireless communication device that may prevent saturation of signal power of received signals amplified in the frequency domain.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of controlling a signal power of a received signal received by a wireless communication device, the method comprising:
    measuring the signal power of the received signal at a plurality of time points in response to a gain control signal;
    calculating a variance of the signal power of the received signal at least some time points of the plurality of time points, wherein the calculating of the variance of the signal power of the received signal includes calculating the variance of the signal power of the received signal at an object time point based on a difference between the signal power of the received signal at the object time point and the signal power of the received signal at a time point prior to the object time point;

storing the variance of the signal power of the received signal; and controlling the signal power of the received signal to have a first gain level when the number of frequency resources is less than or equal to a first number; and controlling the signal power of the received signal to have a second gain level, which is greater than the first gain level, when the number of frequency resources is greater than the first number and less than or equal to a second number, which is greater than the first number.

2. The method as claimed in claim 1, wherein the calculating of the variance of the signal power of the received signal includes estimating a number of frequency resources based on the variance of the signal power of the received signal.

3. The method as claimed in claim 2, wherein the number of frequency resources is a number of subcarriers allocated to the received signal, among subcarriers allocated to a frequency band.

4. The method as claimed in claim 2, wherein the controlling of the signal power of the received signal includes determining the gain level based on the number of frequency resources.

5. The method as claimed in claim 1, wherein the calculating of the variance of the signal power of the received signal includes calculating a ratio of an average of the signal power of the received signal to an average of the variance of the signal power of the received signal at the plurality of time points by the variance of the signal power of the received signal.

6. The method as claimed in claim 1, wherein the controlling of the signal power of the received signal includes:
controlling the signal power of the received signal to have a first gain level when the variance of the signal power of the received signal is greater than or equal to a first variance; and
controlling the signal power of the received signal to have a second gain level, which is greater than the first gain level, when the variance of the signal power of the received signal is less than the first variance and greater than or equal to a second variance, which is less than the first variance.

7. The method as claimed in claim 1, further comprising amplifying an analog signal received by the wireless communication device in response to the gain control signal.

8. The method as claimed in claim 7, wherein the measuring of the signal power of the received signal includes generating the received signal by converting the amplified analog signal into a digital signal.

9. The method as claimed in claim 1, wherein the calculating the variance of the signal power of the received signal includes dividing an average (mean) of measured signal power ($Pow_i$) by an average of differences in signal power at least some time points of the plurality of time points as a ratio $P_{ratio}$ according to the following equation:

$$P_{ratio}=\text{mean}(Pow_i)/\text{mean}(|Pow_i-Pow_{i+1}|).$$

10. A communication processor, comprising:
a power measuring module configured to measure signal power of a received signal at a plurality of time points in response to a gain control signal;
a calculating module configured to calculate a variance of the signal power of the received signal at least some time points of the plurality of time points, wherein the calculating module is configured to calculate the variance of the signal power of the received signal at an object time point based on a difference between the signal power of the received signal at the object time point and the signal power of the received signal at a time point prior to the object time point; and
a gain determining module configured to provide, to a variable gain amplifier, a gain level including a first gain level and a second gain level, and to control the signal power of the received signal to have the first gain level when the number of frequency resources is less than or equal to a first number, and control the signal power of the received signal to have the second gain level, which is greater than the first gain level, when the number of frequency resources is greater than the first number and less than or equal to a second number, which is greater than the first number, and store the variance of the signal power of the received signal in a memory.

11. The communication processor as claimed in claim 10, wherein:
the calculating module is configured to estimate a number of frequency resources based on the variance of the signal power of the received signal, and
the gain determining module is configured to determine the gain level based on the estimated number of frequency resources.

12. The communication processor as claimed in claim 11, wherein the number of frequency resources is a number of subcarriers allocated to the received signal, among subcarriers allocated to a frequency band.

13. The communication processor as claimed in claim 10, wherein the gain determining module is configured to control the signal power of the received signal to have the first gain level when the variance of the signal power of the received signal is greater than or equal to a first variance, and control the signal power of the received signal to have the second gain level, which is greater than the first gain level, when the variance of the signal power of the received signal is less than the first variance and greater than or equal to a second variance, which is less than the first variance.

14. The communication processor as claimed in claim 10, wherein the power measuring module is configured to estimate the signal power of the received signal based on a digital signal converted from an analog signal which is amplified to have a target signal power according to the gain control signal.

15. The communication processor as claimed in claim 10, wherein the calculating module is configured to calculate the variance of the signal power of the received signal by dividing an average (mean) of measured signal power ($Pow_i$) by an average of differences in signal power at least some time points of the plurality of time points as a ratio $P_{ratio}$ according to the following equation:

$$P_{ratio}=\text{mean}(Pow_i)/\text{mean}(|Pow_i-Pow_{i+1}|).$$

16. A wireless communication device, comprising:
a receiving module configured to receive a gain control signal and a received signal;
a communication processor configured to output a gain level at which a signal power of the received signal is controlled, based on preset correspondence of the gain level to a calculated variance of the signal power of the received signal in response to the gain control signal; and a variable gain amplifier configured to control the signal power of the received signal based on the gain level, wherein the communication processor is configured to:
measure the signal power of the received signal at a plurality of time points, and calculate the variance of the signal power of the received signal at least some time points of the plurality of time points, calculate the calculated variance of the signal power of the received signal at an object time point based on a difference between the signal power of the received signal at the object time point and the signal power of the received signal at a time point prior to the object time point, and provide, to the variable gain amplifier, a gain level including a first gain level and a second gain level, and control the signal power of the received signal to have the first gain level when the number of frequency resources is less than or equal to a first number, and control the signal power of the received signal to have a second gain level, which is greater than the first gain level, when the number of frequency resources is greater than the first number and less than or equal to a second number, which is greater than the first number, and store the variance of the signal power of the received signal in a memory.

17. The wireless communication device as claimed in claim 16, wherein the communication processor is configured to estimate a number of frequency resources based on the variance of the signal power of the received signal, and determine the gain level based on the estimated number of frequency resources.

18. The wireless communication device as claimed in claim 16, wherein the communication processor is configured to calculate the variance of the signal power of the received signal by dividing an average (mean) of measured signal power ($Pow_i$) by an average of differences in signal power at least some time points of the plurality of time points as a ratio $P_{ratio}$ according to the following equation:

$$P_{ratio} = \text{mean}(Pow_i)/\text{mean}(|Pow_i - Pow_{i+1}|).$$

* * * * *